(12) United States Patent
Morris, III

(10) Patent No.: US 8,902,113 B2
(45) Date of Patent: Dec. 2, 2014

(54) TUNABLE DUPLEXING ANTENNA AND METHODS

(75) Inventor: Arthur S. Morris, III, Raleigh, NC (US)

(73) Assignee: Wispry, Inc., Irvine, CA (US)

( * ) Notice: Subject to any disclaimer, the term of this patent is extended or adjusted under 35 U.S.C. 154(b) by 394 days.

(21) Appl. No.: 12/431,373

(22) Filed: Apr. 28, 2009

(65) Prior Publication Data

US 2009/0267851 A1    Oct. 29, 2009

Related U.S. Application Data

(60) Provisional application No. 61/125,747, filed on Apr. 28, 2008.

(51) Int. Cl.
| | |
|---|---|
| H01Q 9/00 | (2006.01) |
| H01Q 21/00 | (2006.01) |
| H01Q 1/38 | (2006.01) |
| H01Q 1/52 | (2006.01) |
| H01Q 1/50 | (2006.01) |
| H01Q 23/00 | (2006.01) |
| H01Q 9/04 | (2006.01) |

(52) U.S. Cl.
CPC ............ *H01Q 9/0421* (2013.01); *H01Q 23/00* (2013.01); *H01Q 1/38* (2013.01)
USPC .................... 343/745; 343/893; 343/700 MS; 343/841; 343/844; 343/853; 343/858; 343/861

(58) Field of Classification Search
CPC ......... H01Q 9/00; H01Q 1/38; H01Q 9/0421; H01Q 9/145
USPC .......... 343/745, 893, 700 MS, 841, 844, 853, 343/858, 861
See application file for complete search history.

(56) References Cited

U.S. PATENT DOCUMENTS

| | | | |
|---|---|---|---|
| 5,231,407 A | 7/1993 | McGirr et al. | |
| 6,061,024 A | 5/2000 | McGirr et al. | |
| 6,333,719 B1 * | 12/2001 | Varadan et al. | 343/787 |
| 6,735,418 B1 | 5/2004 | MacNally et al. | |
| 7,035,611 B2 | 4/2006 | Garlepp et al. | |
| 7,116,952 B2 | 10/2006 | Arafa | |
| 7,283,793 B1 | 10/2007 | McKay | |

(Continued)

FOREIGN PATENT DOCUMENTS

| | | |
|---|---|---|
| EP | 2 609 686 | 7/2013 |
| KR | 2005 0069746 | 7/2005 |

(Continued)

OTHER PUBLICATIONS

"A Capacitively Loaded PIFA for Compact Mobile Telephone Handsets," Rowell, IEEE Transactions on Antennas and Propagation, vol. 45, No. 5, May 1997.*

(Continued)

*Primary Examiner* — Graham Smith
(74) *Attorney, Agent, or Firm* — Jenkins, Wilson, Taylor & Hunt, P.A.

(57) ABSTRACT

Tunable duplexers and related methods are disclosed for use in communications networks. A tunable radiating duplexer can include a first antenna comprising a first variable capacitor and a second antenna comprising a second variable capacitor.

16 Claims, 11 Drawing Sheets

(56) References Cited

U.S. PATENT DOCUMENTS

| | | | |
|---|---|---|---|
| 7,446,628 | B2 | 11/2008 | Morris |
| 7,865,149 | B2 | 1/2011 | Han et al. |
| 8,073,400 | B2 | 12/2011 | Gorbachov |
| 8,106,848 | B2 | 1/2012 | Rofougaran |
| 8,170,510 | B2 | 5/2012 | Knudsen |
| 8,311,496 | B2 | 11/2012 | Rofougaran |
| 2001/0017602 | A1 | 8/2001 | Hieb |
| 2002/0140612 | A1* | 10/2002 | Kadambi et al. .............. 343/702 |
| 2002/0183013 | A1 | 12/2002 | Auckland |
| 2004/0087341 | A1* | 5/2004 | Edvardsson .............. 455/562.1 |
| 2004/0127178 | A1 | 7/2004 | Kuffner |
| 2005/0057399 | A1* | 3/2005 | Kipnis et al. ........... 343/700 MS |
| 2005/0164647 | A1 | 7/2005 | Shamsaifar |
| 2006/0217082 | A1 | 9/2006 | Fischer |
| 2007/0049213 | A1* | 3/2007 | Tran ................................ 455/78 |
| 2007/0222697 | A1 | 9/2007 | Caimi |
| 2008/0107093 | A1 | 5/2008 | Meiyappan et al. |
| 2008/0122723 | A1 | 5/2008 | Rofougaran |
| 2009/0096517 | A1 | 4/2009 | Huang et al. |
| 2009/0231220 | A1 | 9/2009 | Zhang et al. |
| 2010/0053018 | A1 | 3/2010 | Rofougaran |
| 2010/0225543 | A1 | 9/2010 | Kakitsu et al. |
| 2012/0169565 | A1 | 7/2012 | Morris, III |
| 2012/0286892 | A1 | 11/2012 | Gu et al. |
| 2013/0165067 | A1 | 6/2013 | Devries et al. |

FOREIGN PATENT DOCUMENTS

| | | |
|---|---|---|
| WO | WO 2007-025309 | 3/2007 |
| WO | WO 2012/027703 | 3/2012 |
| WO | WO 2012/097084 | 6/2012 |

OTHER PUBLICATIONS

Nishio et al., "A Study of Wideband Built-In Antenna Using RF-MEMS Variable Capacitor for Digital Terrestrial Broadcasting," Antennas and Propag. Soc. Int'l Symposium 206, IEEE Jan. 1, 2006—ISBN: 978-1-4244-0123-9.

European Search Report/Office Action for EP Appl. No. 09739590.9 dated Nov. 7, 2011.

International Search Report and Written Opinion for PCT/US2011/049410 dated Feb. 21, 2012.

International Search Report and Written Opinion for PCT/US2011/064459 dated Aug. 22, 2012.

Chinese Office Action for Application No. 200980113013.7 dated Dec. 5, 2012.

Restriction Requirement for U.S. Appl. No. 13/219,343 dated Jul. 15, 2013.

Chinese Office Action for Application No. 2009801130137 dated Aug. 2, 2013.

Notice of Allowance for U.S. Appl. No. 13/219,343 dated Sep. 5, 2013.

"Wireless Demands Focus Designers on Integration," Nancy Friedrich, Microwaves and RF, Feb. 19, 2010.

"Reconfigurable Antennas and RF Front Ends for Portable Wireless Devices," David T. Auckland et al. Proceeding of the SDR 02 Technical Conference and Product Exposition.

European Communication regarding Search Report for EP Application No. 11820747 dated Apr. 1, 2014.

Chinese Office Action for Application No. 2014041400934240 dated Apr. 17, 2014.

* cited by examiner

TUNABLE DUPLEXING ANTENNA AND METHODS

RELATED APPLICATIONS

The presently disclosed subject matter claims the benefit of U.S. Provisional Patent Application Ser. No. 61/125,747, filed Apr. 28, 2008, the disclosure of which is incorporated herein by reference in its entirety.

TECHNICAL FIELD

The subject matter disclosed herein relates generally to duplexers for use in communications networks. More particularly, the subject matter disclosed herein relates to duplexers used in conjunction with communications antennas.

BACKGROUND

In communications systems, duplexers provide the ability to receive and transmit signals while using the same antenna. In a typical transmission operation, only signals of a designated transmission frequency are passed to an antenna, which transmits the signal as a radio signal into the air. In a typical receiving operation, a signal received by an antenna is transmitted to the duplexer to select only a signal of the designated frequency. A duplexer uses resonant circuits to isolate a transmitter from a receiver for allowing the transmitter and the receiver to operate on the same antenna at the same time without the transmitter adversely affecting the receiver. Duplexers use filters, such as various pass band filters and notches to accomplish isolation and continuity in signal transfer. In duplexer operation, filters must pass the desired signal while rejecting as much as possible of the undesired signals.

The increased diversity in the functionality of mobile phones has resulted in an increase in the complexity of duplexer design. For example, increased mobile phone functions such as dual mode (e.g., a combination of an analog mode and a digital mode, or a combination of digital modes, such as TDMA or CDMA), and a dual band (e.g., a combination of an 800 MHz band and a 1.9 GHz band, or a combination of a 900 MHz band and a 1.8 GHz band or a 1.5 GHz band) have been increasing the complexity of mobile phone architecture and circuitry. Increased implementation of frequency related functions affect antenna bandwidth. Antenna bandwidth is generally the range of frequencies over which the antenna can operate while some other characteristic remains in a given range. Therefore, increased frequency ranges increase demand for performance over a number of frequency channels, or a wide bandwidth antenna. Moreover, to support these multiple, diverse functions while maintaining proper isolation and reliable signal transfer between transmitter and receiver operations, present communication devices use fixed, redundant circuitry, such as an increased quantity of switches and filters to compensate and broaden duplexer capabilities. Accordingly, such increased use and quantity of filters creates the need for optimizing filter performance.

There is a continuing demand for component reduction and high performance communications devices. Elimination of redundant components, functions, or circuitry is highly desired in communication electronics. Increased performance in communication devices without increasing device size or weight is similarly desirable. Further, there is a continuing need for reliable and quality signal transfer, improved transmitter-receiver isolation, and very high Q value circuitry with respect to duplexers. In addition, further considerations include polarization, tradeoffs between isolation and size, tuning precision, and transmit/receive frequency spacing for a given band versus wholesale tuning between bands.

Micro-electro-mechanical system (MEMS) technology is currently implemented for various filtering circuitry. Exemplary MEMS components that have been used for filtering include MEMS capacitors and acoustic resonators. Although there have been improvements in the development of MEMS components for filtering, there is a continuing need for improved performance and stability of these components as well as tunability for optimal performance and multi-band applications.

Therefore, room for improvement exists for improved duplexer circuitry and related components and improved MEMS components for use in duplexer circuitry.

SUMMARY

In accordance with this disclosure, duplexers and related methods for use in communications networks are provided. Specifically, in one embodiment, a tunable radiating duplexer is provided and can include a first antenna comprising a first variable capacitor and a second antenna comprising a second variable capacitor.

It is an object of the presently disclosed subject matter to provide a tunable duplexing antenna that can combine the functions of an antenna and a duplexer (and potentially also a matching network and/or filters) and that can lower insertion losses, provide a smaller overall solutions and that may provide operation over multiple communication bands.

Some of the objects of the subject matter disclosed herein having been stated hereinabove, and which are achieved in whole or in part by the presently disclosed subject matter, other objects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides designs and methods for tunable duplexing antennas. In one aspect, the present subject matter provides a tunable radiating duplexer, generally designated 100 in FIG. 1, which can include two or more tunable narrow band antennas in or on a single substrate. For instance, tunable radiating duplexer can include a first antenna 101 in communication with a receive terminal RX and a second antenna 102 in communication with a transmit terminal TX. First antenna 101 can further include a first tunable filter F1 (e.g., a TX filter and/or matching network, if required), and second antenna 102 can include a second tunable filter F2 (e.g., a harmonic filter and/or matching network, if required). First and second antennas 101 and 102 can be tuned to address multiple frequency bands, and can be tuned to adjust frequency spacing between the elements. For example, a distance between the first and second antennas can be less than about ¼ of a free-space wavelength, and/or first and second antennas 101 and 102 can be sized less than about ¼ of a free-space wavelength. Further, the first and second antennas can be co-polarized.

Figure 1:
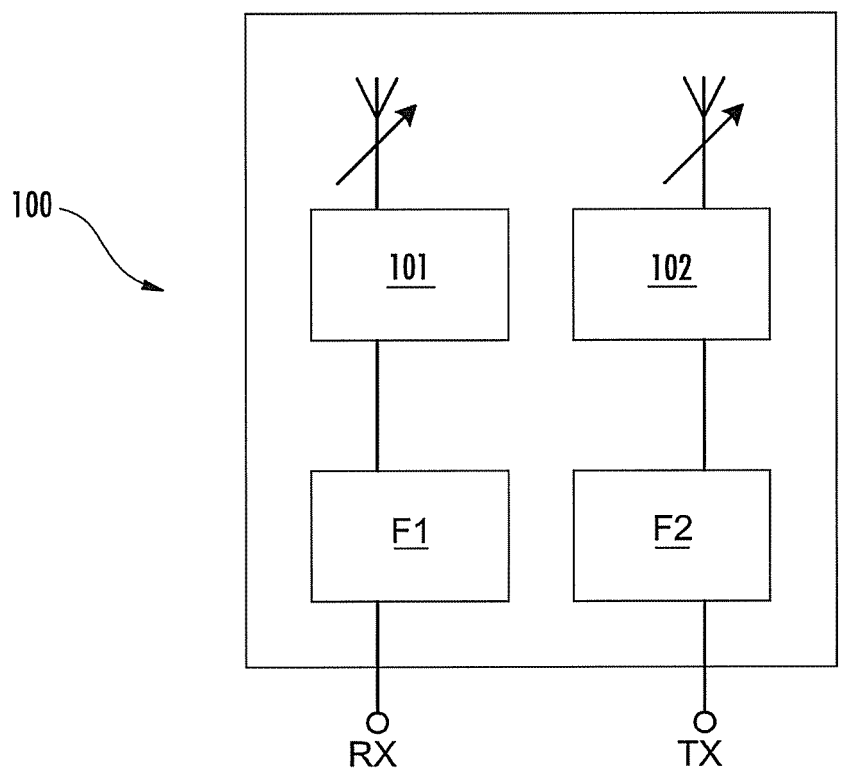
FIG. 1 is a schematic drawing of a tunable radiating duplexer according to an embodiment of the presently disclosed subject matter.

As a result, a tunable antenna of the type in FIG. 1 can be smaller than a full-band antenna and much smaller than multi-band antenna. In particular, more than two tunable antennas can be configured to fit into a volume of an existing fixed antenna. In addition, if two antennas with individual feeds are closely spaced but tuned to slightly different frequencies, there will be substantial isolation between the ports. As a result, tunable duplexing antennas can provide a number of advantages over current duplexer designs. Specifically, tunable duplexing antennas can combine the functions of an antenna, a duplexer, a matching network, and/or filters. Further, tunable duplexing antennas can produce lower insertion losses by optimizing matches (e.g. about 1 dB), improving antenna efficiency (e.g., about 0.5 dB), and eliminating duplexer losses (e.g., about 3 dB).

Figure 2A:
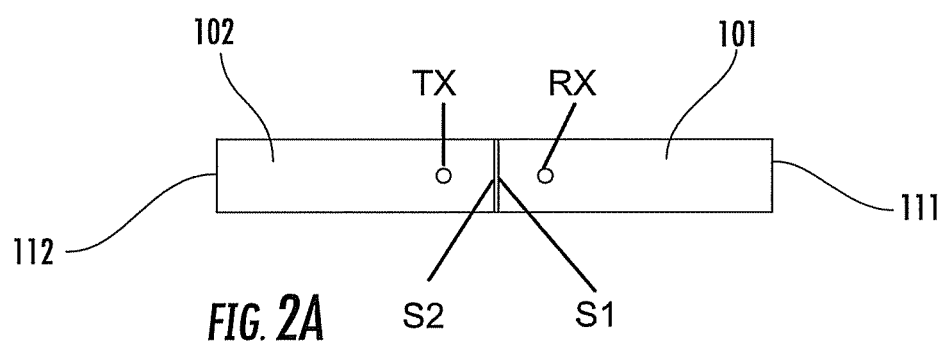
FIGS. 2A and 2B are plan views of arrangements for tunable antennas in a tunable radiating duplexer according to two different embodiments of the presently disclosed subject matter.
Figure 2B:
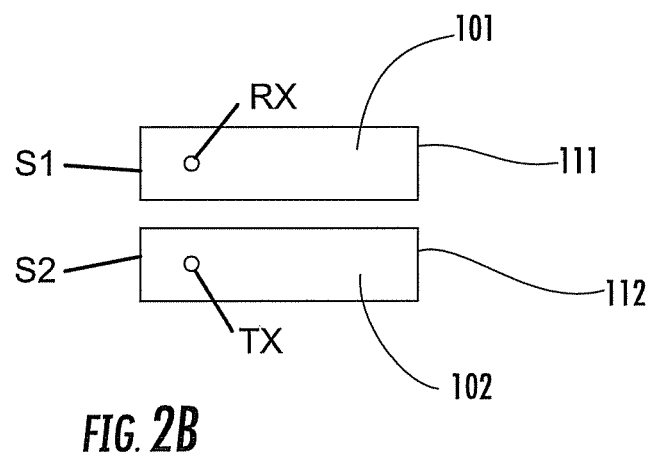

As is shown in FIGS. 2A and 2B, tunable radiating duplexer 100 can be provided in a variety of different configurations. For instance, referring to FIG. 2A, tunable radiating duplexer 100 can include first antenna 101 and second antenna 102 arranged in a back-to-back configuration. In this arrangement, first antenna 101 and second antenna 102 can be positioned such that they share a common short (S1, S2) and have tunable end-loads 111 and 112, respectively. In particular, end loads 111 and 112 can, respectively, be a first and second variable capacitor, such as a MEMS capacitor. The configuration with first and second antennas 101 and 102 being arranged in a back-to-back arrangement can provide desirable isolation for antennas 101 and 102.

Alternatively and as shown in FIG. 2B, first antenna 101 and second antenna 102 can be arranged in a side-by-side configuration. Such a side-by-side configuration can involve first and second antennas 101 and 102 aligned in the same direction as shown, or first and second antennas 101 and 102 can be aligned in opposing directions. In this kind of configuration, each of first and second antennas 101 and 102 can be connected to an independent short S1 and S2, respectively.

Each different configuration provides different characteristics to tunable radiating duplexer 100. For instance, with an in-line configuration (i.e., back-to-back configuration shown in FIG. 2A), coupling can be dominated by mutual inductance, whereas with a side-by-side configuration, coupling is a combination of mutual capacitance and mutual inductance, and ground return currents can yield a magnetic quadrupole. Regardless of the specific arrangement, however, similar elements can be incorporated into the system. Specifically, tunable radiating duplexer 100 can be configured such that each of first and second antennas 101 and 102 includes a tunable end load (e.g., a variable capacitor) including first and second terminals and an antenna comprising first and second transmission lines each including first and second ends. The first ends of the transmission lines can be connected to the circuit terminal and the second ends of the transmission lines can be connected to the first terminal of the variable capacitor and to a ground terminal, respectively. In addition, the second terminal of the variable capacitor can be connected to a ground terminal. Again as described with reference to FIG. 1, first antenna 101 can be in communication with receive terminal RX and second antenna 102 can be in communication with transmit terminal TX in both of the duplexer or antenna embodiments shown in FIGS. 2A and 2B.

Figure 3:
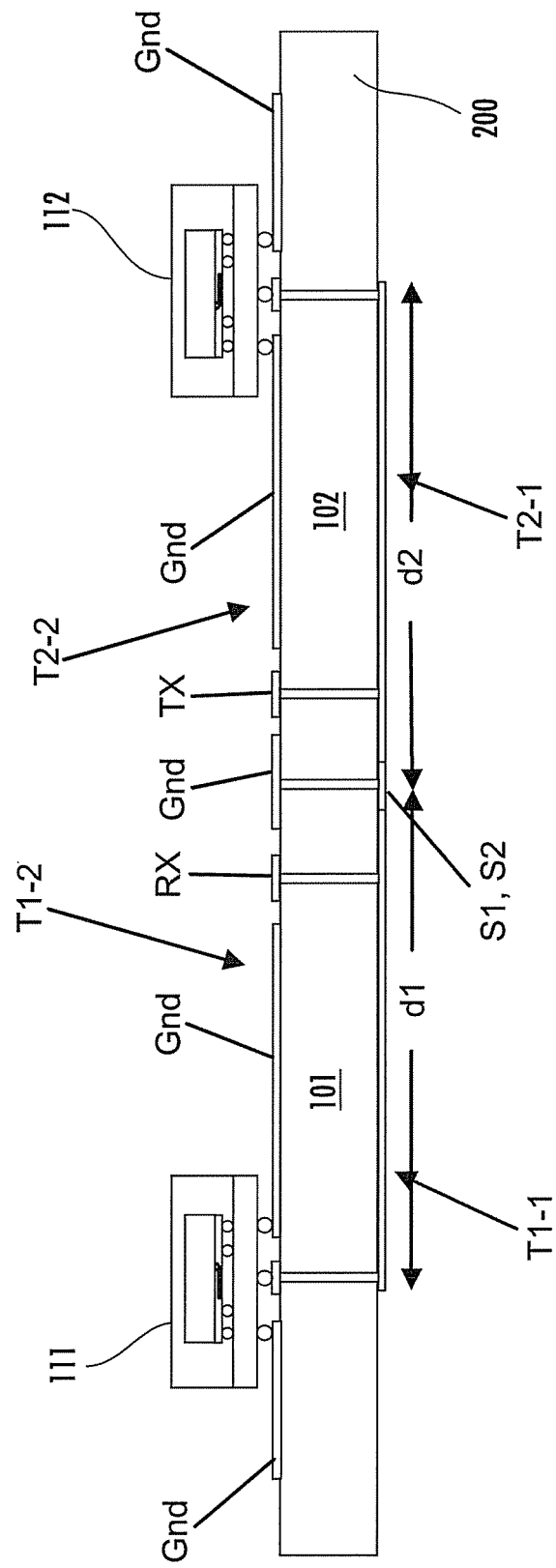
FIG. 3 is a side view of a tunable radiating duplexer according to an in-line embodiment of the presently disclosed subject matter.

FIG. 3 provides a more detailed view of a specific embodiment tunable radiating duplexer 100 in a back-to-back configuration. Tunable radiating duplexer 100 can include a substrate 200 on which both first antenna 101 and second antenna 102 can be formed (e.g., a Roger R4350 PCB). First antenna 101 can have first and second transmission lines generally designated T1-1 and T1-2, respectively, with first transmission line T1-1 connecting receive terminal RX to a first terminal of end load 111 (e.g., a tunable capacitor) and second transmission line T1-2 connected to a ground Gnd. Similarly, second antenna 102 can have first and second transmission lines T2-1 and T2-2, respectively, with first transmission line T2-1 connecting transmit terminal TX to a first terminal of end load 112 (e.g., a tunable capacitor) and second transmission line T2-2 connected to ground Gnd. The first and second transmission lines of at least one of first and second antennas 101 and 102 can be attached to opposing sides of substrate 200. Also, as noted above, tunable radiating duplexer 100 can include at least one short (S1, S2), wherein the second ends of the first transmission lines can be connected to the at least one short.

The first transmission lines of first and second antennas 101 and 102 can be substantially parallel to the second transmission lines of first and second antennas 101 and 102, respectively. Further, in the back-to-back configuration shown in FIG. 3, the first transmission lines of first and second antennas 101 and 102 can be at least substantially aligned so as to be collinear with each other. In addition, the first transmission lines of first and second antennas 101 and 102 can be at least substantially parallel to each another and can be between 1/50 and ¼ of a free space wavelength in length. Similarly, one or both of second transmission lines T1-2 and T2-2 of first and second antennas 101 and 102, respectively, can be sized between about 1/50 and ¼ of a free space wavelength.

The first transmission lines of first and second antennas 101 and 102 have different lengths d1 and d2, respectively, with the ratio approximately equal to a default transmit/receive frequency ratio. For instance, the length d1 of first transmission line T1-1 of first antenna 101 can be about 10 mm, whereas the length d2 of first transmission line T2-1 of second antenna 102 can be greater than 10 mm. Alternatively, the first transmission lines of first and second antennas 101 and 102 have substantially the same length.

Figure 4:
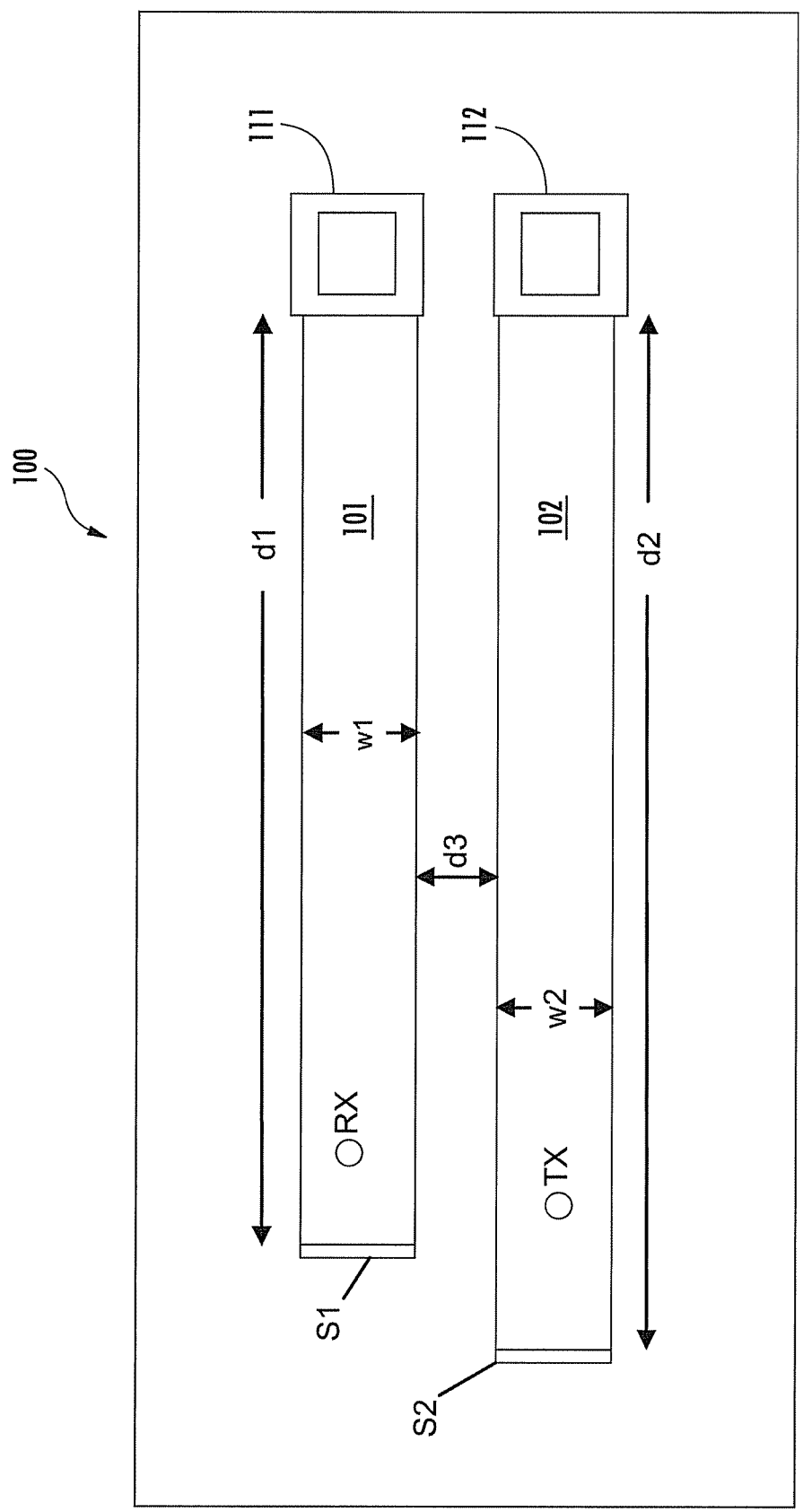
FIG. 4 is a plan view of a tunable radiating duplexer according to a side-by-side embodiment of the presently disclosed subject matter.
Figure 5:
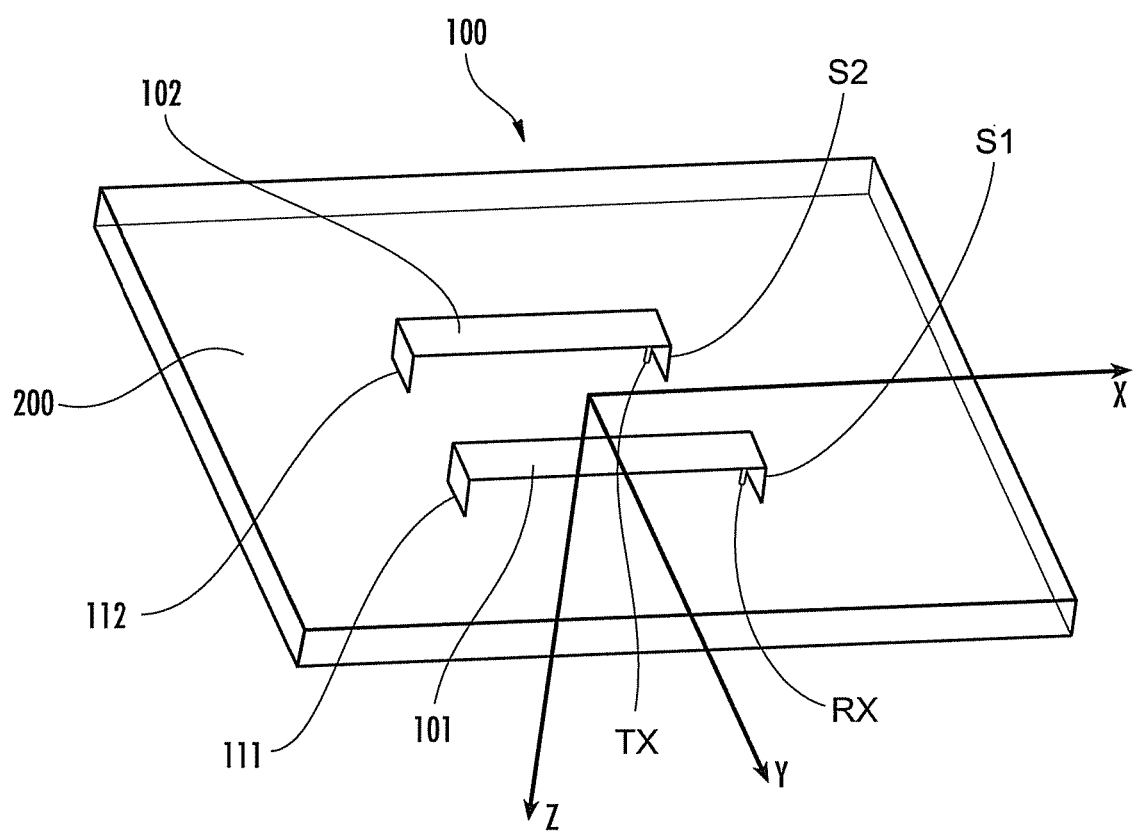
FIG. 5 is a perspective view of a tunable radiating duplexer according to a side-by-side embodiment of the presently disclosed subject matter.

FIGS. 4 and 5 illustrate a different configuration for tunable radiating duplexer 100. In this alternative configuration, first and second antennas 101 and 102 can be arranged in a side-by-side configuration (e.g., as part of a Planar Inverted F Antenna). First and second antennas 101 and 102 can be arranged such that they are facing the same direction (i.e., end loads 111 and 112 are on a same end of first and second antennas 101 and 102, respectively, relative to each other). First antenna 101 can have a first width w1, second antenna 102 can have a second width w2, and first and second antennas 101 and 102 can be separated by a distance d3. For instance, the first transmission lines of first and second antennas 101 and 102 can be spaced from one another between about $\frac{1}{50}$ and $\frac{1}{4}$ of a free space wavelength. Widths w1 and w2 of the antennas can influence efficiency and coupling, while distance d3 between them can influence individual radiating frequencies and isolation.

First and second antennas 101 and 102 can be connected to first and second end loads 111 and 112, respectively, which can be tuning capacitors or single components with multiple terminals. As with the previous configuration, the first transmission lines of first and second antennas 101 and 102 have different lengths d1 and d2, respectively, with the ratio approximately equal to a default transmit/receive frequency ratio. For example, FIG. 5 illustrates an example of a tuned PCB PIFA Duplexer in which the lengths of first and second antennas 101 and 102 can be offset so that the frequency at transmit terminal TX is lower than the frequency at receive terminal RX under the same end loading conditions. Alternatively, the lengths can be designed to be the same, but the capacitance on second antenna 102 (i.e. connected to transmit terminal TX) is higher. Again as described previously, first antenna 101 can be in communication with receive terminal RX and second antenna 102 can be in communication with transmit terminal TX in both of the duplexer or antenna embodiments shown in FIGS. 2A and 2B.

Figure 6A:
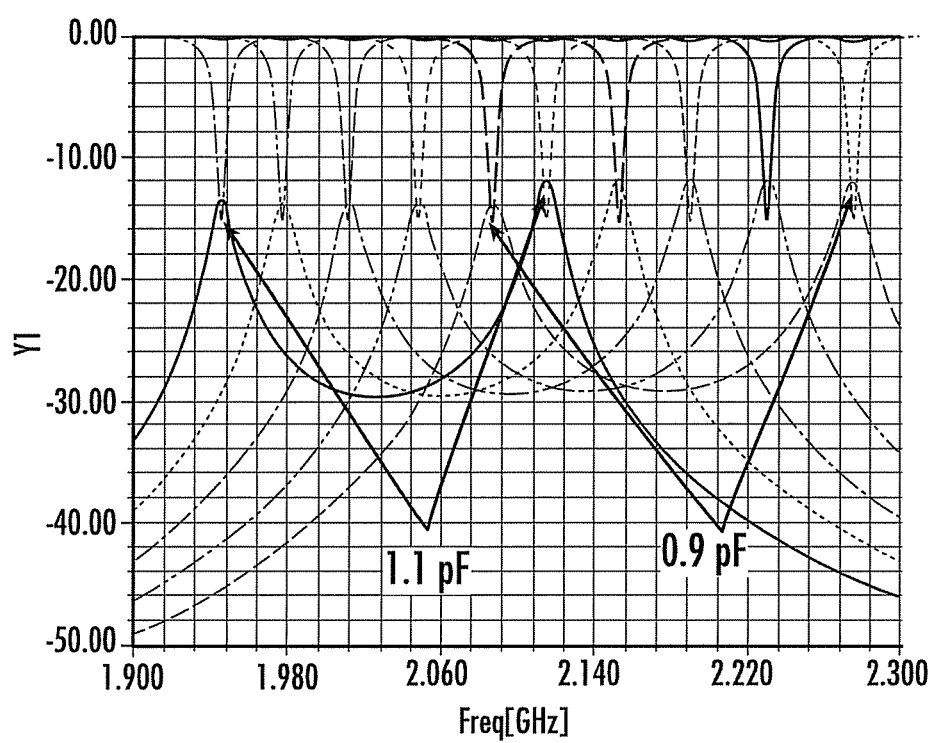
FIGS. 6A through 6C are return loss graphs for different configurations of the tunable radiating duplexer illustrated in FIG. 5.
Figure 6B:
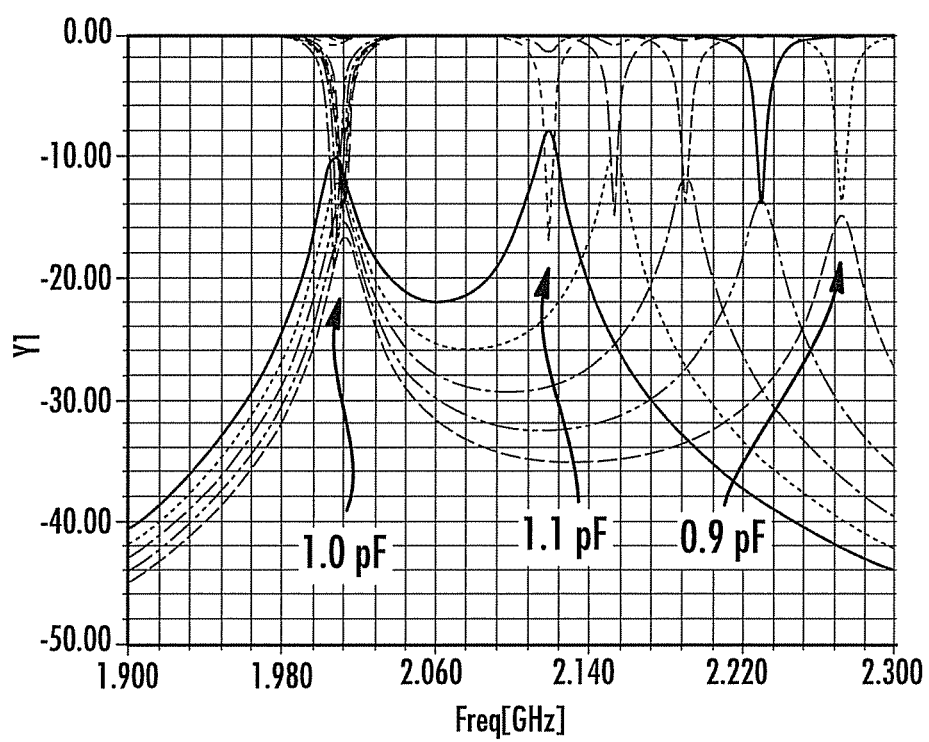
Figure 6C:
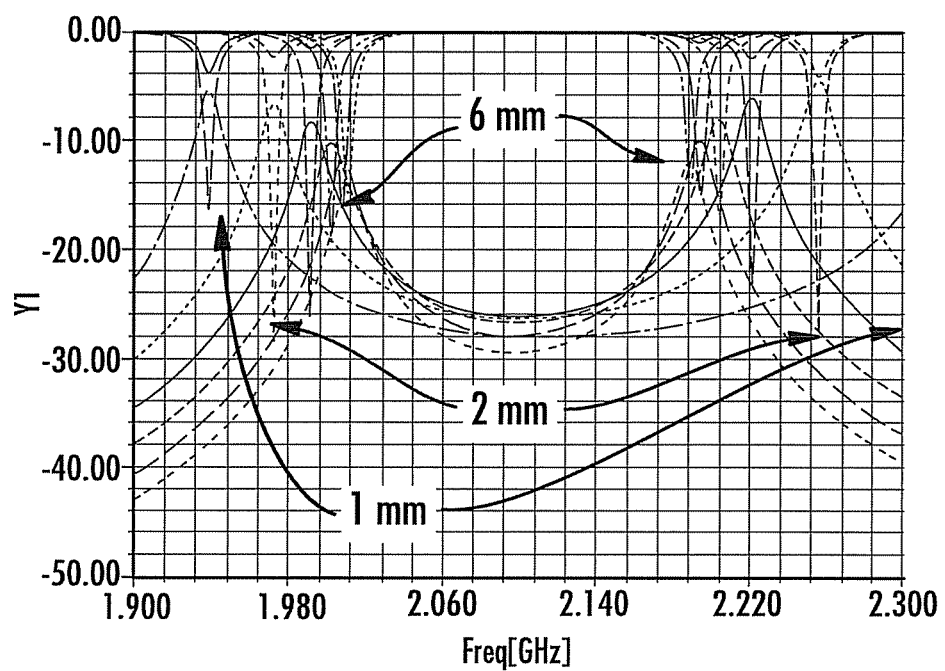

Referring to FIGS. 6A through 6C, return loss graphs for a tuned PCB PIFA duplexer are provided. Referring to FIG. 6A, it can be seen that if both end loads 111 and 112 (e.g., MEMS capacitor banks) are tuned together to sweep transmit and receive signals (i.e., TX/RX) as a pair, the isolation can be between about 12-14 dB, the return loss can be about 14-15 dB, and the spacing can be about 169-187 MHz. Referring to FIG. 6B, however, it can be seen that if one of end loads 111 or 112 (end load 111 in FIG. 6B) is tuned to adjust the spacing between the transmit/receive frequencies, the isolation can be about 8-15 dB, the return loss can be about 14-16 dB, and the tuned spacing can be between 111 and 263 MHz with a 0.2 pF change. Further, in the third example configuration shown in FIG. 6C, it can be seen that if the lateral spacing between antenna elements is adjusted (i.e., the gap varied from about 1 to 6 mm), and the end loads 111 and 112 held at a constant 1 pF, the isolation at low spacing (e.g., about 1 mm) is only about 5 dB. Good isolation can be achieved, however, where the spacing is on the order of one-half the antenna length (e.g., about 6 mm for a 10 mm antenna). It is also noted that inter-coupling also affects frequency spacing, thereby causing larger transmit/receive separation.

Figure 7:
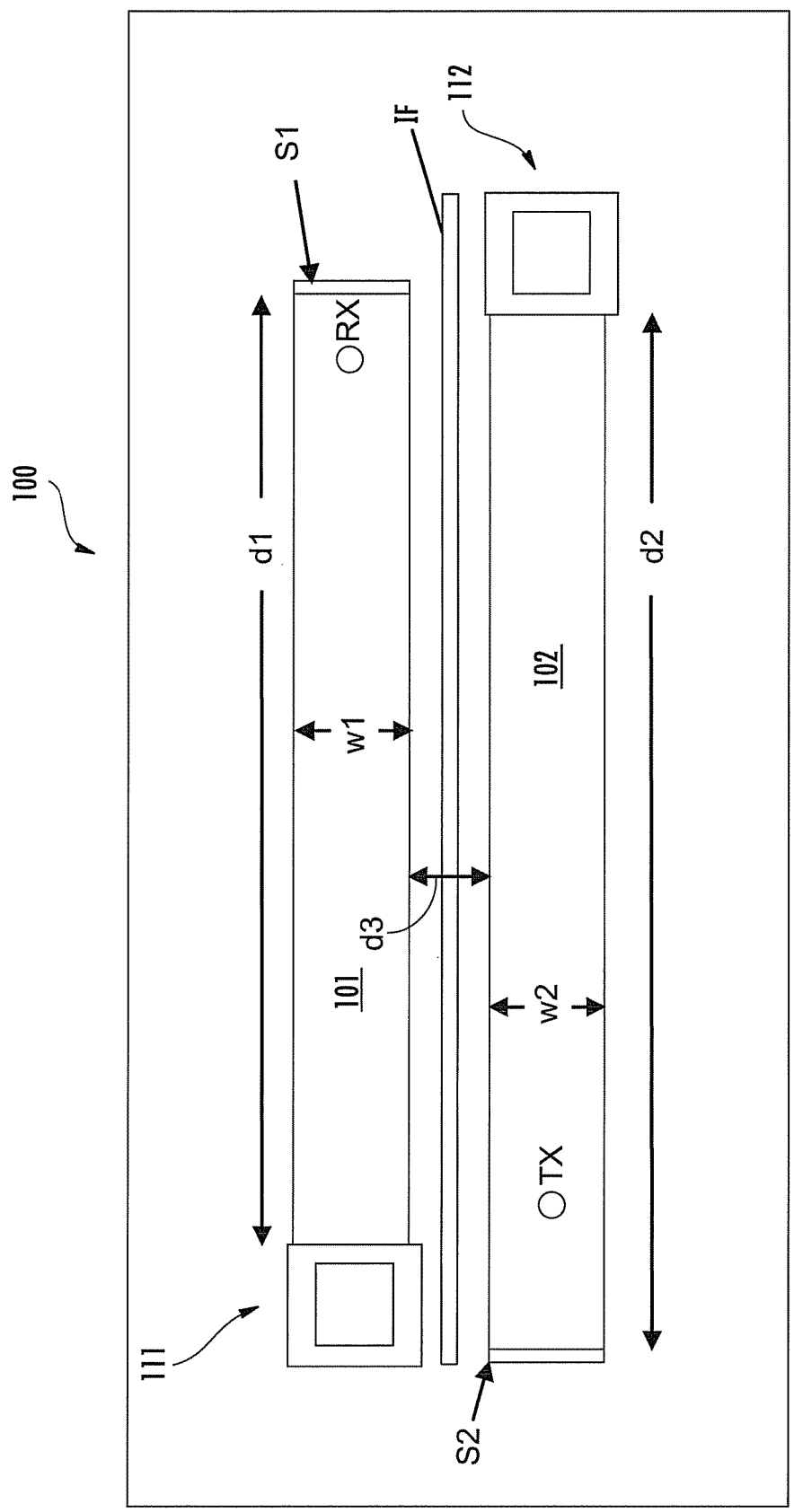
FIG. 7 is a plan view of a tunable radiating duplexer according to a side-by-side embodiment of the presently disclosed subject matter in which the antennas are positioned opposing each other.
Figure 8:
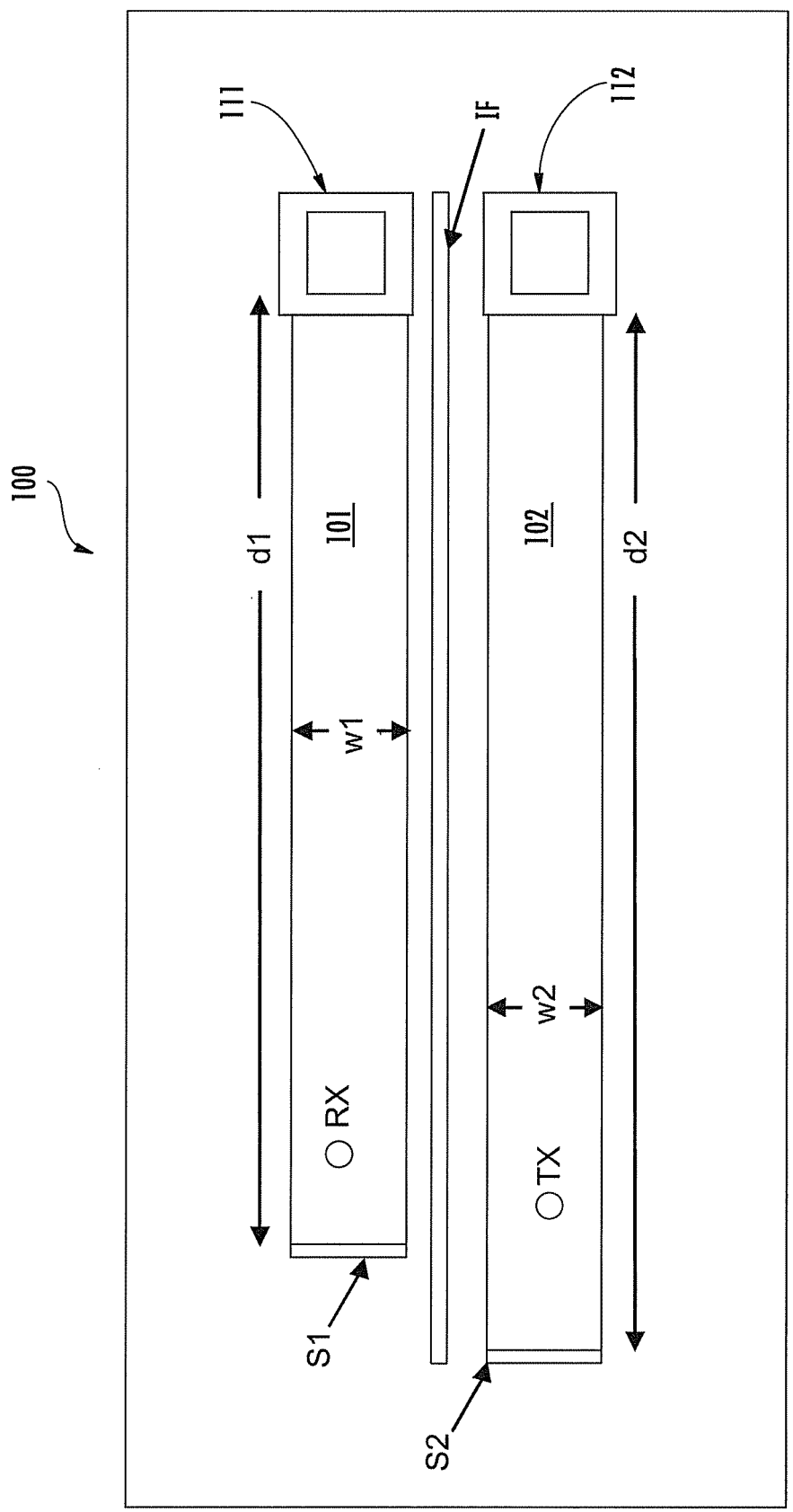
FIG. 8 is a plan view of a tunable radiating duplexer according to a side-by-side embodiment of the presently disclosed subject matter in which an isolation fence separates the antennas.

Still further alternative configurations are shown in FIGS. 7 and 8. In the configuration shown in FIG. 7, first and second antennas 101 and 102 can be arranged in a side-by-side configuration, but in opposing directions (i.e., end loads 111 and 112 are on different ends of first and second antennas 101 and 102, respectively, relative to each other), which can improve isolation. Tunable radiating duplexer 100 can further optionally include a grounded isolation fence IF positioned between first and second antennas 101 and 102, which can also serve to improve isolation. In the configuration shown in FIG. 8, first and second antennas 101 and 102 are arranged to be facing in the same direction in a side-by-side configuration with a grounded isolation fence IF positioned between them. Of course, tunable radiating duplexer 100 can be used for a variety of applications beyond PIFA designs, including loops, a directly tuned cellular antenna, a DVB-H antenna, cellular diversity antenna, or any other loaded antenna concept, whether they be PCB based or case-mounted.

Figure 9:
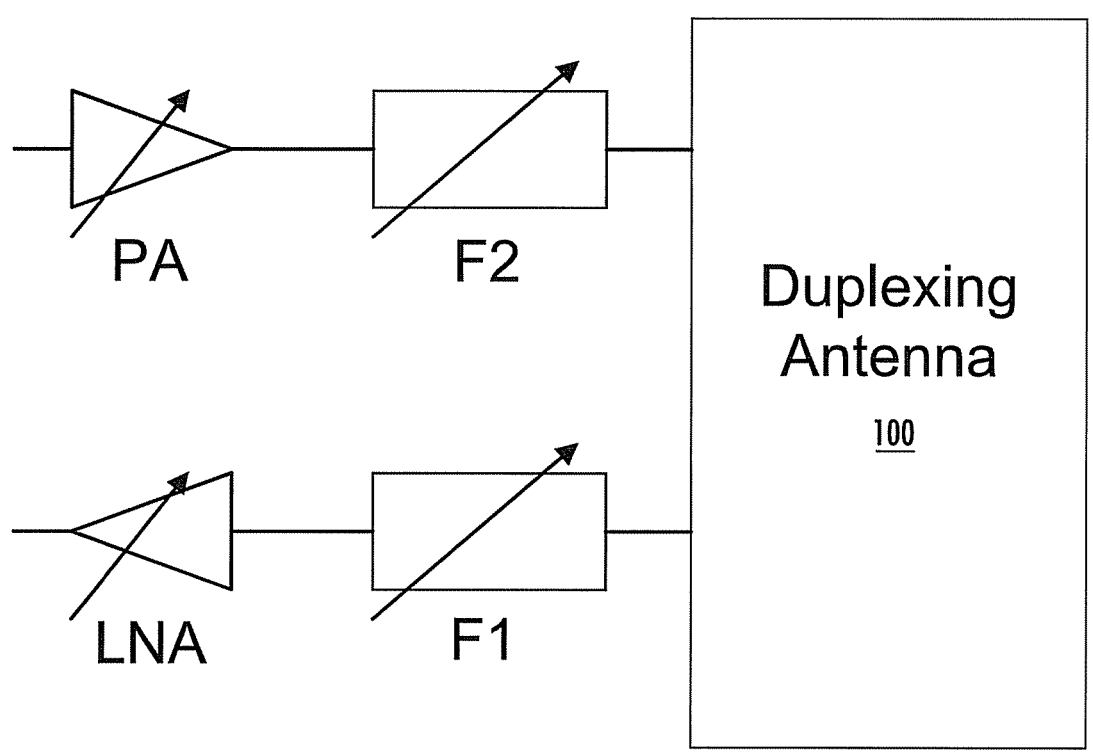
FIG. 9 is a schematic drawing of a tunable radiating duplexer according to an embodiment of the presently disclosed subject matter.

Regardless of the specific configuration of first and second antennas 101 and 102, tunable radiating duplexer 100 can include a tunable matching network on a circuit terminal of each of first and second antennas 101 and 102. Specifically, tunable radiating duplexer 100 can include RF circuitry coupled to either or both of the antenna circuit ports to provide amplification and filtering for transmit and receive signals. For instance, referring to FIG. 9, amplifiers, filters, and/or matching circuits can be included in the design of tunable radiating duplexer 100. Specifically, elements such as a low noise amplifier LNA and/or a first filter F1 (e.g., a matching network, TX filter or other blockers) can be provided in communication with receive terminal RX, and other elements such as a power amplifier PA or a second filter F2 (e.g., a harmonics or operating point matching filter) can be provided in communication with transmit terminal TX.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A tunable radiating duplexer comprising:
  a substrate having a first surface and a second surface opposing the first surface;
  a first antenna formed on the substrate, the first antenna comprising a first transmission line formed on the first surface of the substrate and a first grounded element formed on the second surface of the substrate substantially opposing the first transmission line, the first grounded element being connected to a first ground, the first transmission line comprising a first end and a second end opposing the first end, the second end being connected to a first short, a first circuit terminal being connected between the first end and the second end, and the first transmission line having a length between $\frac{1}{50}$ and $\frac{1}{12}$ of a free space wavelength corresponding to a first communications operating frequency;
  a first variable capacitor attached to the second surface of the substrate, the first variable capacitor comprising first and second terminals, the first terminal being connected through the substrate to the first end of the first transmission line, and the second terminal being connected to the first grounded element;
  a second antenna formed on the first surface of the substrate, the second antenna comprising a second transmission line formed on the first surface of the substrate and a second grounded element formed on the second surface of the substrate substantially opposing the second transmission line, the second grounded element being connected to a second ground, the second transmission line comprising a first end and a second end opposing the first end, the second end being connected to a second short, a second circuit terminal being connected between the first end and the second end, and the second transmission line having a length between $1/50$ and $1/12$ of a free space wavelength corresponding to a second communications operating frequency that is different than the first communications operating frequency; and a second variable capacitor attached to the second surface of the substrate, the second variable capacitor comprising first and second terminals, the first terminal being connected through the substrate to the first end of the second transmission line, and the second terminal being connected to the second grounded element.

2. The tunable radiating duplexer of claim 1 wherein the first and second variable capacitors are MEMS capacitors.

3. The tunable radiating duplexer of claim 1 wherein the first and second antennas are co-polarized.

4. The tunable radiating duplexer of claim 1 wherein the first and second antennas are tuned to address multiple frequency bands.

5. The tunable radiating duplexer of claim 1 wherein the first and second antennas are tuned to adjust frequency spacing between the elements.

6. The tunable radiating duplexer of claim 1 wherein the first and second antennas are substantially parallel to each other.

7. The tunable radiating duplexer of claim 1 wherein the first and second antennas are positioned in substantially opposing directions.

8. The tunable radiating duplexer of claim 1 wherein the first and second antennas are arranged in an end-to-end configuration.

9. The tunable radiating duplexer of claim 1 wherein a distance between the first and second antennas is less than about $1/4$ of a free-space wavelength.

10. The tunable radiating duplexer of claim 1 comprising a tunable matching network on a circuit terminal of each of the first and second antennas.

11. The tunable radiating duplexer of claim 10 comprising RF circuitry coupled to either or both of the antenna circuit ports to provide amplification and filtering for transmit and receive signals.

12. The tunable radiating duplexer of claim 1 wherein the first and second transmission lines of the first and second antennas, respectively, are substantially parallel to the first and second grounded elements of the first and second antennas, respectively.

13. The tunable radiating duplexer of claim 1 wherein the first and second transmission lines of the first and second antennas, respectively, are substantially parallel to each another.

14. The tunable radiating duplexer of claim 1 wherein the first and second transmission lines of the first and second antennas, respectively, have different lengths with the ratio approximately equal to a default transmit/receive frequency ratio.

15. The tunable radiating duplexer of claim 1 wherein the first and second transmission lines of the first and second antennas, respectively, have substantially the same length.

16. The tunable radiating duplexer of claim 1 wherein the first and second transmission lines of the first and second antennas, respectively, are substantially collinear with each other.

* * * * *